(12) United States Patent
Im

(10) Patent No.: US 9,147,772 B2
(45) Date of Patent: Sep. 29, 2015

(54) COMPLEMENTARY METAL OXIDE SEMICONDUCTOR CIRCUIT STRUCTURE, PREPARATION METHOD THEREOF AND DISPLAY DEVICE

(71) Applicant: BOE TECHNOLOGY GROUP CO., LTD., Beijing (CN)

(72) Inventor: Jang Soon Im, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/103,175

(22) Filed: Dec. 11, 2013

(65) Prior Publication Data
US 2014/0159038 A1  Jun. 12, 2014

(30) Foreign Application Priority Data
Dec. 12, 2012  (CN) .......................... 2012 1 0537549

(51) Int. Cl.
H01L 29/10  (2006.01)
H01L 29/786  (2006.01)
H01L 27/12  (2006.01)

(52) U.S. Cl.
CPC ........ *H01L 29/7869* (2013.01); *H01L 27/1225* (2013.01); *H01L 27/1251* (2013.01)

(58) Field of Classification Search
CPC ........................... H01L 29/7869; H01L 21/16
USPC ............................................. 257/43; 438/199
See application file for complete search history.

(56) References Cited

U.S. PATENT DOCUMENTS 5,625,199 A * 4/1997 Baumbach et al. ............. 257/40
7,767,520 B2 * 8/2010 Kamath et al. ................ 438/249
8,134,152 B2 * 3/2012 Choi et al. ........................ 257/43
8,467,825 B2 * 6/2013 Kato et al. ................. 455/550.1

(Continued)

FOREIGN PATENT DOCUMENTS

CN           1649152 A     8/2005
CN         102280491 A    12/2011
CN         202948923 A     5/2013

OTHER PUBLICATIONS

Second Chinese Office Action dated Feb. 10, 2015; Appln. No. 201210537549.5.
First Chinese Office Action dated Nov. 3, 2014; Appln. No. 201210537549.5.

(Continued)

*Primary Examiner* — Jami M Valentine
(74) *Attorney, Agent, or Firm* — Ladas & Parry LLP

(57) ABSTRACT

Provided are a CMOS circuit structure, a preparation method thereof and a display device, wherein a PMOS region in the CMOS circuit structure is of a LTPS TFT structure, that is, the PMOS semiconductor layer is prepared from a P type doped polysilicon material; an NMOS region is of an Oxide TFT structure, that is, the NMOS semiconductor layer is made of an oxide material; three doping processes applied to the NMOS region during the LTPS process may be omitted in the case in which the NMOS semiconductor layer in the NMOS region is made of an oxide material instead of the polysilicon material, which may simplify the preparation of the CMOS circuit structure as well as reduce a production cost. Furthermore, it is only required to crystallizing the PMOS semiconductor layer, which may also extend the lifespan of laser tube, contributing to reduction of the production cost.

20 Claims, 8 Drawing Sheets

(56) References Cited

U.S. PATENT DOCUMENTS

| | | | |
|---|---|---|---|
| 8,853,024 B2 * | 10/2014 | Yin et al. | 438/199 |
| 2005/0176194 A1 | 8/2005 | Sasaki et al. | |
| 2010/0176395 A1 | 7/2010 | Choi et al. | |
| 2012/0305910 A1 | 12/2012 | Hsieh et al. | |

OTHER PUBLICATIONS

Third Chinese Office Action dated May 6, 2015; Appln. No. 201210537549.5.

* cited by examiner

COMPLEMENTARY METAL OXIDE SEMICONDUCTOR CIRCUIT STRUCTURE, PREPARATION METHOD THEREOF AND DISPLAY DEVICE

TECHNICAL FIELD OF THE DISCLOSURE

The present disclosure relates to the technical field of circuit preparation, and in particular to a complementary metal oxide semiconductor (CMOS) circuit structure, a preparation method thereof and a display device.

BACKGROUND

Complementary metal oxide semiconductor (CMOS) comprises P-channel metal oxide semiconductor (PMOS, Positive channel Metal Oxide Semiconductor) and N-Channel metal oxide semiconductor (NMOS, Negative channel Metal Oxide Semiconductor).

At present, semiconductor layers in a PMOS region and an NMOS region in a CMOS circuit are generally prepared separately by a low temperature polysilicon technology (LTPS), the preparation is relatively complex, and the specific process steps are as follows:

In step 1: On a base substrate 01, a pattern of a PMOS semiconductor layer 02 in a PMOS region A and a pattern of an NMOS semiconductor layer 03 in an NMOS region B are formed by a patterning process, as shown in FIG. 1a;

wherein, the preparation of the PMOS semiconductor layer 02 and NMOS semiconductor layer 03 particularly includes: a layer of a-Si material is formed on the base substrate 01, a polysilicon material is generated after a laser crystallization is applied to the layer of a-Si material, and then the pattern of the PMOS semiconductor layer 02 and the pattern of the NMOS semiconductor layer 03 are formed with the polysilicon material through a patterning process;

In step 2: a gate insulating layer 04 is formed on the PMOS semiconductor layer 02 and the NMOS semiconductor layer 03, a gate material is deposited on the gate insulating layer 04, and then a pattern of a PMOS gate 05 in the PMOS region A and a pattern of an NMOS gate 06 in the NMOS region B are formed through a patterning process, as shown in FIG. 1b;

In step 3: the PMOS semiconductor layer 02 is doped with P type ions, in particular, a pattern of a doping barrier layer 07 is formed on the NMOS gate 06 through a patterning process for covering the NMOS region B, as shown in FIG. 1c; P type ions are injected into the base substrate 01 with the doping barrier layer 07, and P-type doped polysilicon is formed in the regions of the PMOS semiconductor layer 02 uncovered by the PMOS gate 05, as shown in FIG. 1d; and after the injection of P type ions, the doping barrier layer 07 is stripped.

In step 4: the NMOS semiconductor layer 03 is doped with N type ions, the particular process for N type ion doping is same as that for the P type ion doping, and detailed description is omitted herein.

In step 5: a LDD (Lightly-Doped-Drain) doping process and a Ch (Channel) doping process are applied to the NMOS semiconductor layer sequentially, and both of the LDD doping process and the Ch doping process are similar to the P type ion doping process, the detailed description is omitted herein.

In step 6: a pattern of an interlayer dielectric layer 08 is formed on the PMOS gate and the NMOS gate through a patterning process, as shown in FIG. 1e.

In step 7: a pattern of PMOS source/drain 09 in the PMOS region A and a pattern of NMOS source/drain 10 in the NMOS region B are formed on the interlayer dielectric layer 08 through a patterning process, as shown in FIG. 1f.

Specifically, after completion of the above steps 1 to 7, the following steps are further required to be performed when the CMOS circuit is applied to an OLED panel.

In step 8: a pattern of a passivation layer 11 is formed on the PMOS source/drain 09 and the NMOS source/drain 10 through a patterning process, and a pattern of a planarization layer 12 is formed on the passivation layer 11 through a patterning process, as shown in FIG. 1g.

In step 9: a pattern of a pixel layer used as an anode is formed on the planarization layer through a patterning process, the pixel layer is electrically connected to the source or the drain of the PMOS source/drain, as shown in FIG. 1h.

In Step 10: a pattern of a pixel defining layer is formed on the pixel layer through a patterning process, as shown in FIG. 1i.

In the preparation of the CMOS circuit with the LTPS process, at least 10 photolithography masks and at least four doping processes (P type ion doping, N type ion doping, LDD doping and Ch doping) are required, so the preparation is complex and has a high production cost; in addition, the entire layer of a-Si material is subject to laser crystallization to obtain the polysilicon material in step 1, such long-time laser crystallization process leads to an increased production cost and a reduced lifespan of a laser tube, which also contributes to the increased production cost.

SUMMARY

In embodiments of the present disclosure, there is provided a CMOS circuit structure, a preparation method thereof and a display device for optimizing the CMOS circuit structure in the prior art and optimizing a preparation process thereof so as to reduce the production cost.

The CMOS circuit structure provided in the embodiments of the present disclosure has a PMOS region and an NMOS region, and comprises a PMOS semiconductor layer, a gate insulating layer, PMOS gate and NMOS gate, a first interlayer dielectric layer, an NMOS semiconductor layer, a second interlayer dielectric layer, and PMOS source/drain and NMOS source/drain successively located above a base substrate, wherein, the PMOS semiconductor layer, the PMOS gate and the PMOS source/drain are located within the PMOS region; and the PMOS semiconductor layer is made of a P type doped polysilicon material;

the NMOS semiconductor layer, the NMOS gate and the NMOS source/drain are located within the NMOS region; and the NMOS semiconductor layer is made of an oxide material.

The display device provided in the embodiments of the present disclosure comprises the CMOS circuit structure provided in the embodiments of the present disclosure.

The preparation method of the CMOS circuit structure provided in the embodiments of the present disclosure comprises:

forming a pattern of a PMOS semiconductor layer in a PMOS region on a base substrate, the PMOS semiconductor layer being made of a polysilicon material;

forming a gate insulating layer on the PMOS semiconductor layer, and forming a pattern of a PMOS gate in the PMOS region and a pattern of an NMOS gate in an NMOS region on the gate insulating layer;

doping the PMOS semiconductor layer with P type ions;

forming a first interlayer dielectric layer on the PMOS gate and the NMOS gate; and forming a pattern of an NMOS semiconductor layer in the NMOS region on the first interlayer dielectric layer, the NMOS semiconductor layer being made of an oxide material;

forming a pattern of a second interlayer dielectric layer on the NMOS semiconductor layer; and forming a pattern of PMOS source/drain in the PMOS region A and a pattern of NMOS source/drain in the NMOS region on the second interlayer dielectric layer.

The embodiments of the present disclosure can achieve the following beneficial effects: in the CMOS circuit structure, the preparation method thereof and the display device provided in the embodiments of the present disclosure, the PMOS region is of a LTPS TFT structure, that is, the PMOS semiconductor layer is prepared from the P type doped polysilicon material; the NMOS region is of a Oxide TFT structure, that is, the NMOS semiconductor layer is made of an oxide material; three doping processes applied to the NMOS region during the LTPS process may be omitted in the case in which the NMOS semiconductor layer in the NMOS region is made of an oxide material instead of the existing polysilicon material, which may simplify the preparation of the CMOS circuit structure as well as reduce a production cost. Further, the NMOS region is designed to be of a bottom-gate-type TFT structure, which may lead to omission of a step of setting a doping barrier layer before injecting P type ions into the PMOS region, simplifying the preparation of the CMOS circuit structure. Furthermore, since the NMOS semiconductor layer of the NMOS region is made of the oxide material, it is only required to crystallizing the PMOS semiconductor layer of the PMOS region, which may also prolong the lifespan of laser tube, contributing to reduction of the production cost.

DETAILED DESCRIPTION

Below, in combination with the accompanying drawings, specific implementations of a CMOS circuit structure, a preparation method thereof and a display device provided in embodiments of the present disclosure will be described in detail.

The shape and size of respective regions in the accompany drawings do not reflect a real scale of the CMOS circuit structure, and are merely for illustration.

Figure 1A:
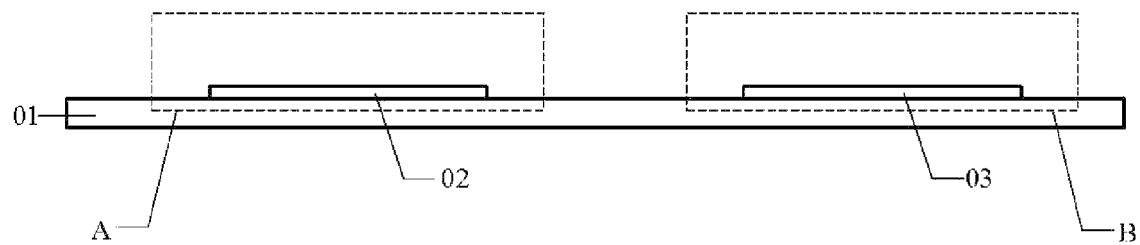
FIGS. 1a to 1i are schematic diagrams showing the respective steps of preparation of a conventional CMOS circuit using a LTPS method.
Figure 1B:
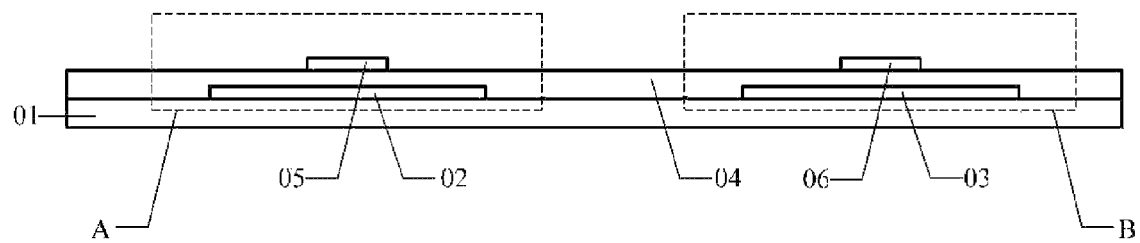
Figure 1C:
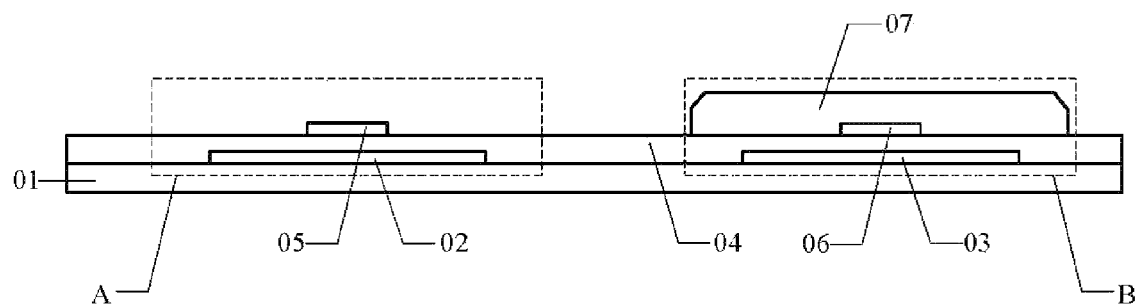
Figure 1D:
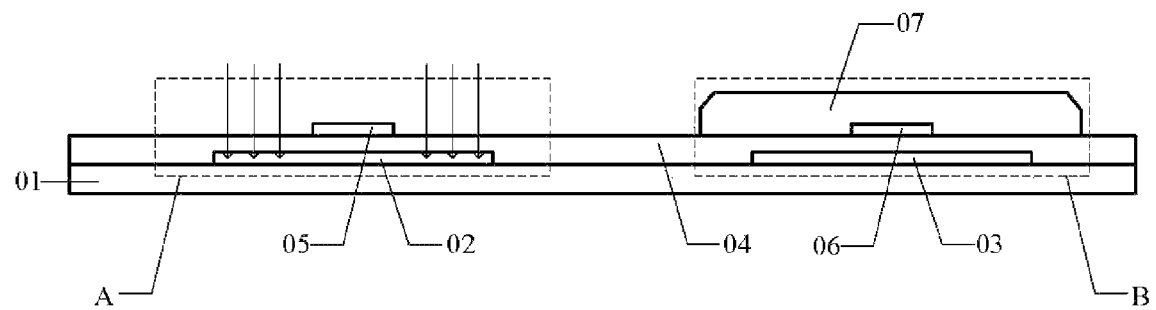
Figure 1E:
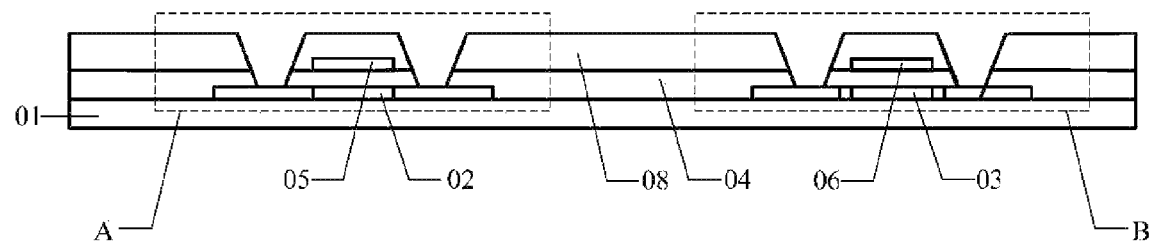
Figure 1F:
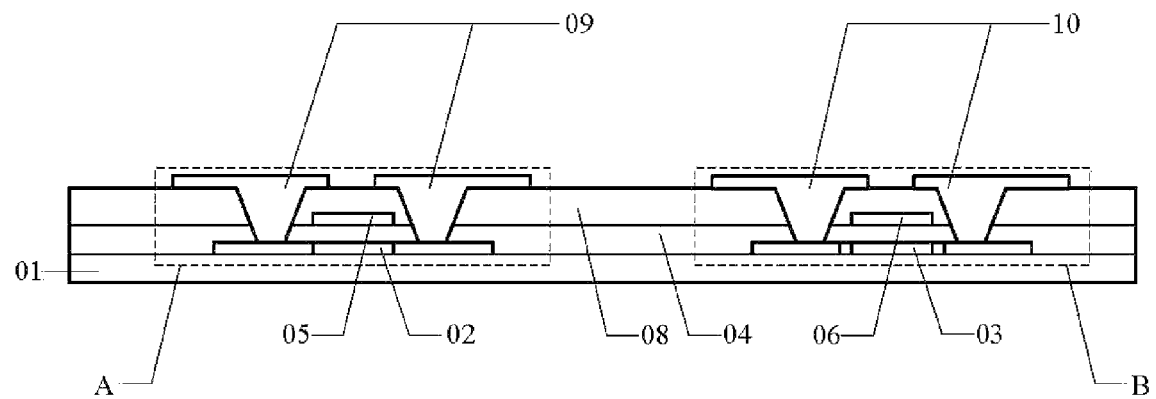
Figure 1G:
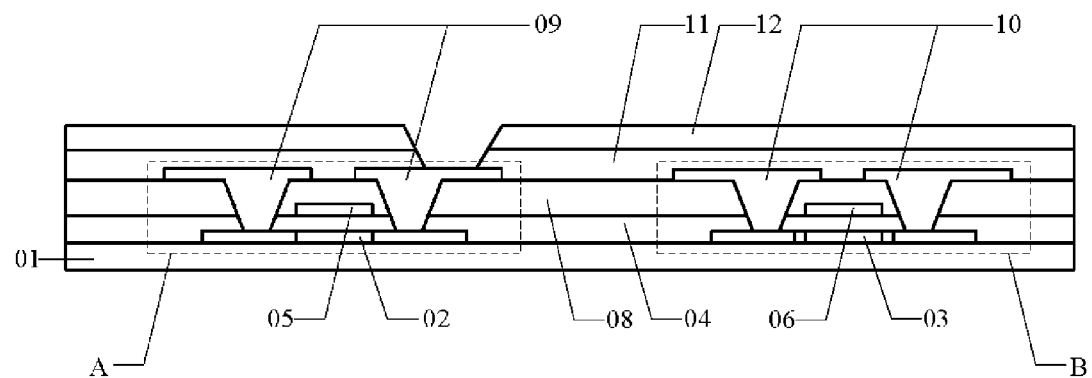
Figure 1H:
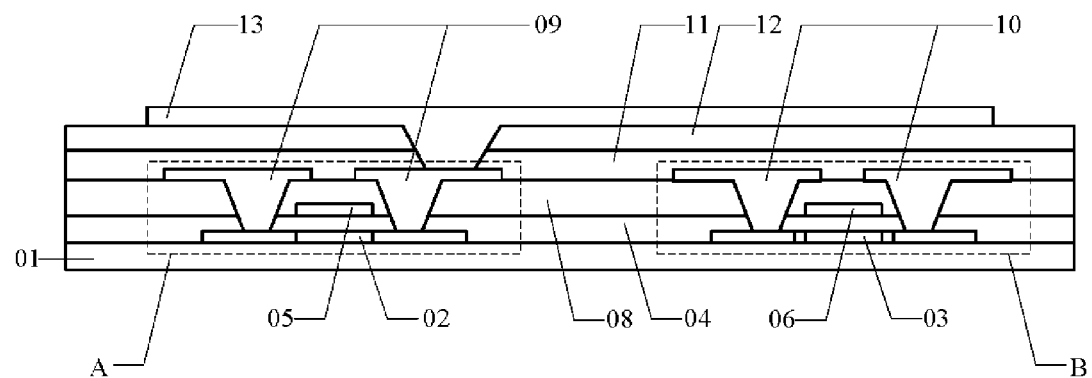
Figure 1I:
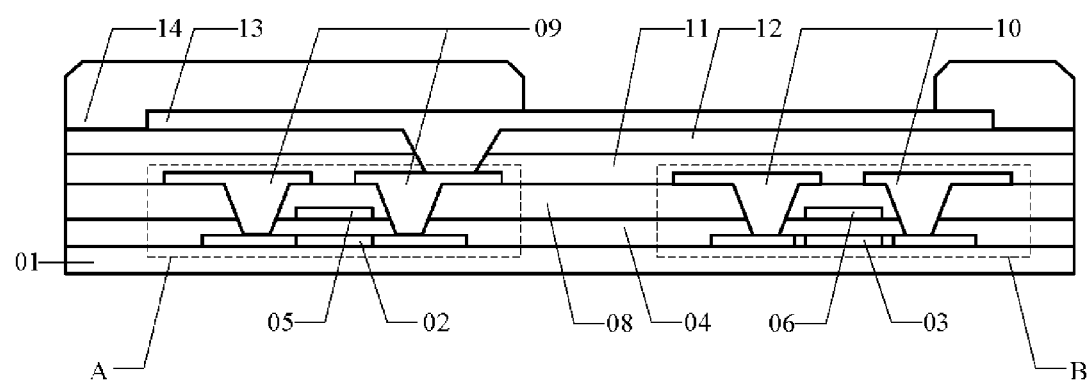
Figure 2:
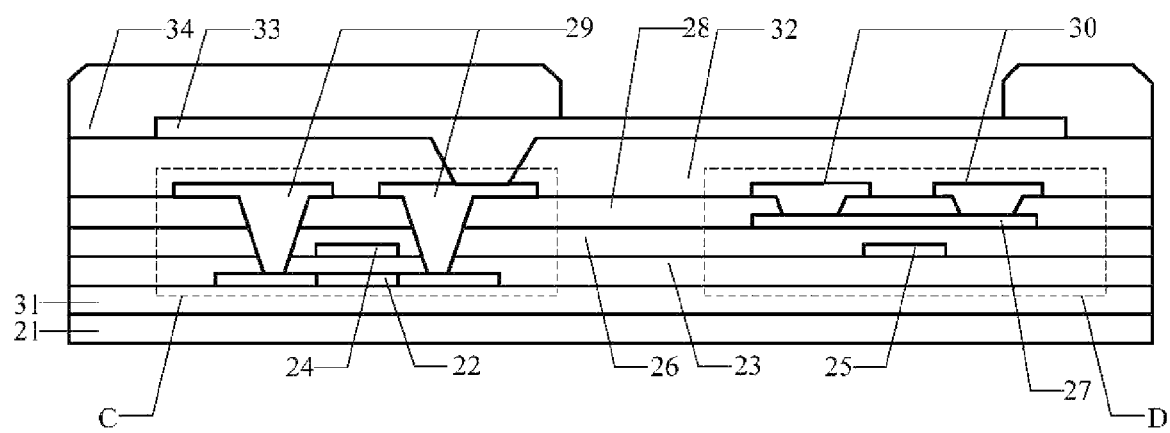
FIG. 2 is a schematic diagram showing a CMOS circuit structure provided in embodiments of the present disclosure.

As shown in FIG. 2, a CMOS circuit structure provided in the embodiments of the present disclosure has a PMOS region C and an NMOS region D, and comprises a PMOS semiconductor layer 22, a gate insulating layer 23, PMOS gate 24 and NMOS gate 25, a first interlayer dielectric layer 26, an NMOS semiconductor layer 27, a second interlayer dielectric layer 28, and PMOS source/drain 29 and NMOS source/drain 30 successively located above a base substrate 21, wherein, the PMOS semiconductor layer 22, the PMOS gate 24 and the PMOS source/drain 29 are located within the PMOS region C; and the PMOS semiconductor layer 22 is made of a P type doped polysilicon material;

the NMOS semiconductor layer 27, the NMOS gate 25 and the NMOS source/drain 30 are located within the NMOS region D; and the NMOS semiconductor layer 27 is made of an oxide material.

Specifically, as shown in FIG. 2, the PMOS source/drain 29 are connected to the PMOS semiconductor layer 22 through a via-hole; and the NMOS source/drain 30 are connected to the NMOS semiconductor layer 27 through a via-hole.

In the above CMOS circuit structure provided in the embodiments of the present disclosure, the PMOS region is of a LTPS TFT structure, that is, the PMOS semiconductor layer is made of a P type doped polysilicon material; the NMOS region is of a Oxide TFT structure, that is, the NMOS semiconductor layer is made of the oxide material; three doping processes applied to the NMOS region during the LTPS process may be omitted, in the case in which the NMOS semiconductor layer in the NMOS region is made of the oxide material instead of the existing polysilicon material, which may simplify the preparation of the CMOS circuit structure as well as reduce a production cost. Further, the NMOS region is designed to be of a bottom-gate-type TFT structure, which may lead to omission of a step of setting a doping barrier layer before injecting P type ions into the PMOS region, simplifying the preparation of the CMOS circuit structure. Furthermore, since the NMOS semiconductor layer of the NMOS region is made of the oxide material, it is only required to crystallizing the PMOS semiconductor layer of the PMOS region, which may also prolong the lifespan of laser tube, contributing to reduction of the production cost.

In a particular implementation, the oxide material for preparing the NMOS semiconductor layer 27 may be at least one of indium gallium zinc oxide (IGZO), zinc oxide (ZnO), indium zinc oxide (IZO), indium tin zinc oxide (ITZO) and the like, and no limitation is made to the present disclosure herein.

Furthermore, in the above CMOS circuit structure, in order to avoid the case in which the characteristics are deteriorated due to the direct contact of the PMOS semiconductor layer 22 made of the polysilicon material with the base substrate 21, a buffer layer 31 may also be set between the base substrate 21 and the PMOS semiconductor layer 22, as shown in FIG. 2.

Specifically, as shown in FIG. 2, when the above CMOS circuit structure provided in the embodiments of the present disclosure can be applied to an OLED panel, it may further comprise the following structure having layers:

a planarization layer 32, and a pixel layer 33 as an anode successively located on the PMOS source/drain 29 and the NMOS source/drain 30, and wherein the pixel layer 33 are electrically connected to the source or the drain of the PMOS source/drain 29 through a via-hole.

In a particular implementation, the planarization layer 32 may be prepared from an organic resin material.

Further, as shown in FIG. 2, the CMOS circuit structure may comprise a pixel defining layer 34 above the pixel layer 33 for defining a pixel region.

The above-described CMOS circuit structure provided in the embodiments of the present disclosure may be applied to an active matrix organic light-emitting device, may also be applied to a TFT-LCD, and no limitation is made to the present disclosure herein.

Based on the same inventive concept, in the embodiments of the present disclosure, there is further provided a display device including the above-described CMOS circuit structure provided in the embodiments of the present disclosure, implementations for the display device may be obtained with reference to the implementations of the above CMOS circuit structure, and repeated descriptions will be omitted herein.

Specifically, the display device may be a TN-type LCD display device, a FFS-type LCD display device, an IPS-type LCD display device, an ADS-type LCD display device or an OLED display device. The display device may also comprise OLED panels, mobile phones, tablet computers, televisions, monitors, notebook computers, digital photo frames, navigation systems and any other products or parts with display functions.

Figure 3:
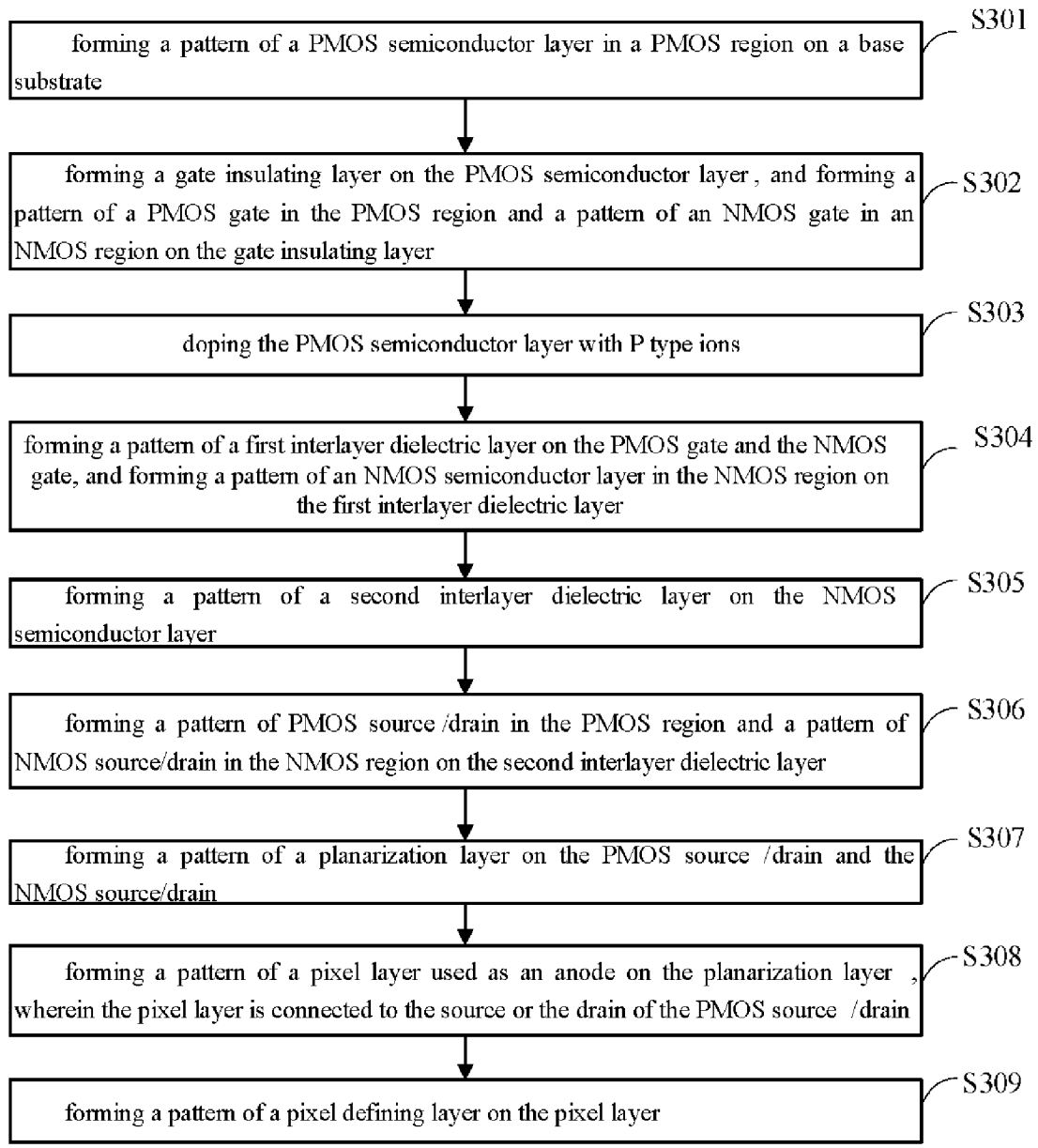
FIG. 3 is a flowchart showing a preparation method of the CMOS circuit structure provided in the embodiments of the present disclosure.

Based on the same inventive concept, in the embodiments of the present disclosure, there is further provided a preparation method of the above-described CMOS circuit structure. As shown in FIG. 3, the preparation method specifically includes the following steps.

Figure 4A:
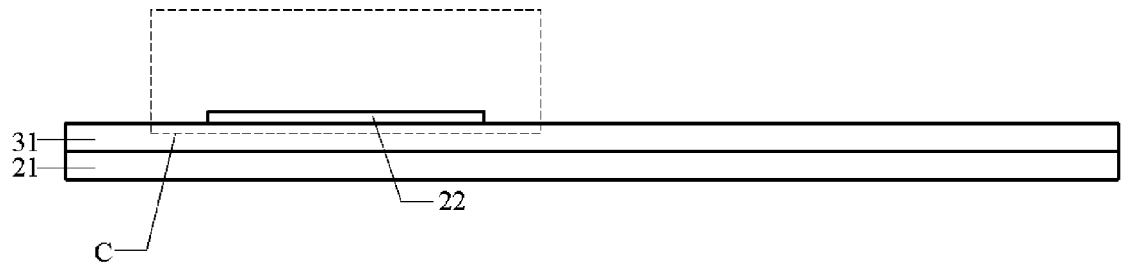
FIGS. 4a to 4h are schematic diagrams showing the respective steps of preparation of the CMOS circuit structure provided in the embodiments of the present disclosure.

In step S301, a pattern of a PMOS semiconductor layer 22 in a PMOS region C is formed on a base substrate 21, as shown in FIG. 4a, the PMOS semiconductor layer 22 is made of a polysilicon material.

Preferably, before the pattern of the PMOS semiconductor layer 22 in the PMOS region C is formed on the base substrate 21, a buffer layer 31 may be firstly formed on the base substrate 21, as shown in FIG. 4a, so as to avoid the case in which the characteristics are deteriorated due to the direct contact of the PMOS semiconductor layer 22 made of the polysilicon material with the base substrate 21.

Specifically, for a specific implementation of the step of forming the pattern of the PMOS semiconductor layer 22 in the PMOS region C on the base substrate 21, a pattern of a layer of a-Si material is first formed on the base substrate 21, and then the layer of a-Si material may be crystallized to form the PMOS semiconductor layer 22 in manner of U-crystallization, laser annealing, selective laser sintering, metal induced crystallization (MIC), metal induced lateral crystallization or continuous granular crystalline silicon. Since the above crystallization manners are conventional manners, no more detailed description will be given herein.

Figure 4B:
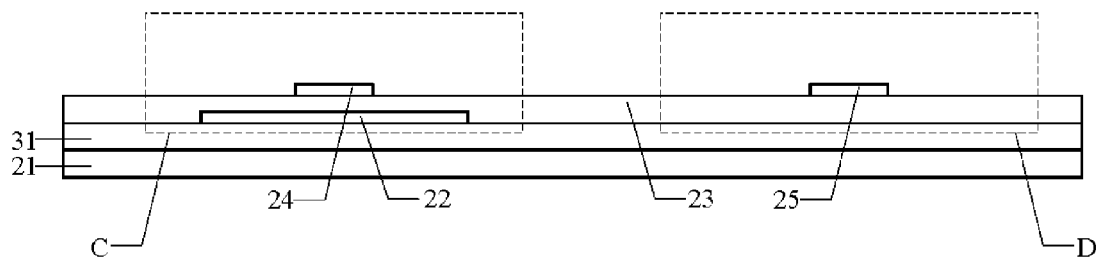

In step S302, a gate insulating layer 23 is formed on the PMOS semiconductor layer 22, and a pattern of a PMOS gate 24 in the PMOS region C and a pattern of an NMOS gate 25 in an NMOS region D are formed on the gate insulating layer 23, as shown in FIG. 4b.

Figure 4C:
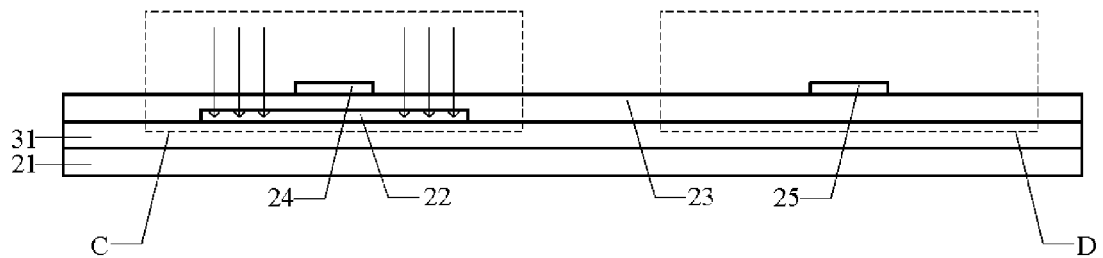

In step S303, the PMOS semiconductor layer 22 is doped with P type ions, as shown in FIG. 4c.

Specifically, since an NMOS semiconductor layer has not been formed in the NMOS region, therefore, P type ions can be directly injected into the PMOS region on the base substrate 21, eliminating a process for setting a doping barrier layer in the NMOS region.

Figure 4D:
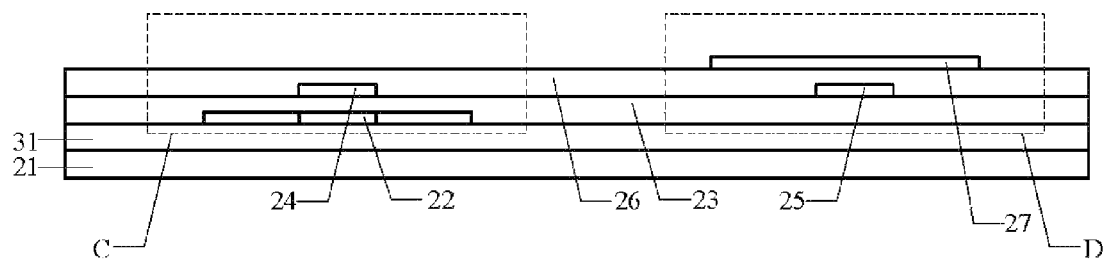

In step S304, a pattern of a first interlayer dielectric layer 26 is formed on the PMOS gate 24 and the NMOS gate 25; and a pattern of an NMOS semiconductor layer 27 in the NMOS region is formed on the first interlayer dielectric layer 26, as shown in FIG. 4d, the NMOS semiconductor layer 27 is made of an oxide material.

Specifically, when the pattern of the NMOS semiconductor layer 27 in the NMOS region is formed on the first interlayer dielectric layer 26, the NMOS semiconductor layer 27 may be formed in manner of sputtering, atomic layer deposition or metal organic chemical vapor deposition. Since the above manners for forming the NMOS semiconductor layer 27 belong to the common knowledge in the prior art, no detailed description will be given herein.

Figure 4E:
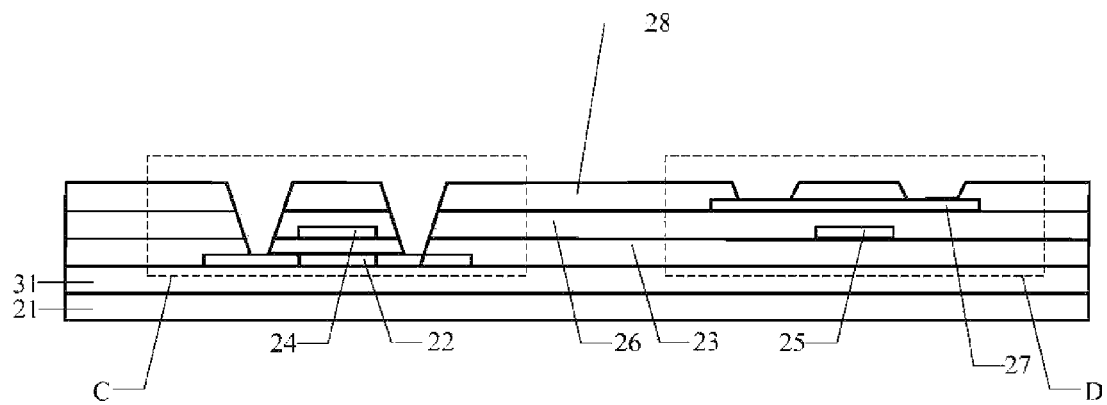

In step S305, a pattern of a second interlayer dielectric layer 28 is formed on the NMOS semiconductor layer 27, as shown in FIG. 4e.

Figure 4F:
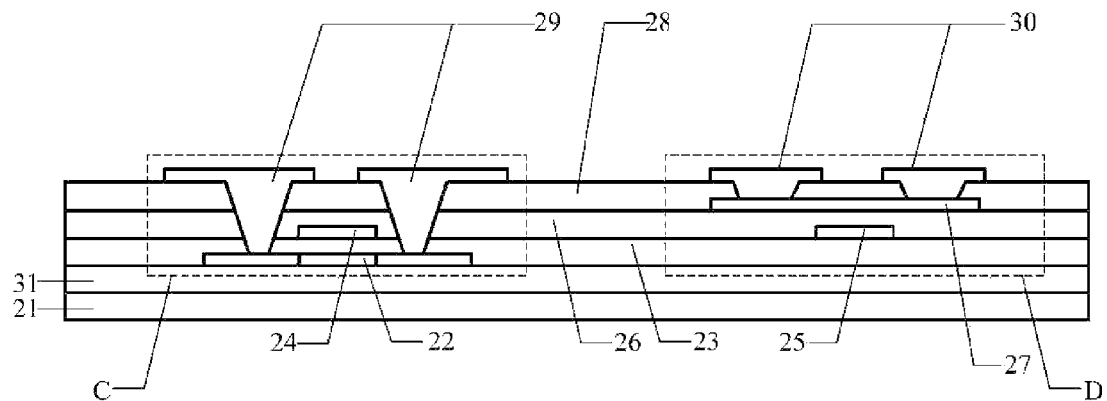

In step S306, a pattern of PMOS source/drain 29 in the PMOS region C and a pattern of NMOS source/drain 30 in the NMOS region D are formed on the second interlayer dielectric layer 28, as shown in FIG. 4f.

In a particular implementation, when the above-described CMOS circuit is applied to an OLED panel, after completion of the above steps S301-S306, as shown in FIG. 3, the following steps are also required.

Figure 4G:
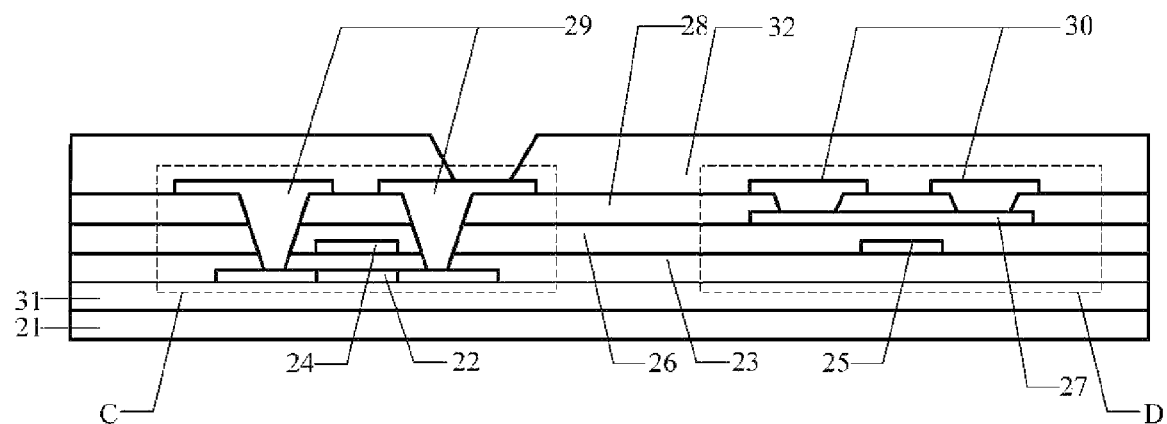

In step S307, a pattern of a planarization layer 32 is formed on the PMOS source/drain 29 and the NMOS source/drain 30, as shown in FIG. 4g.

Figure 4H:
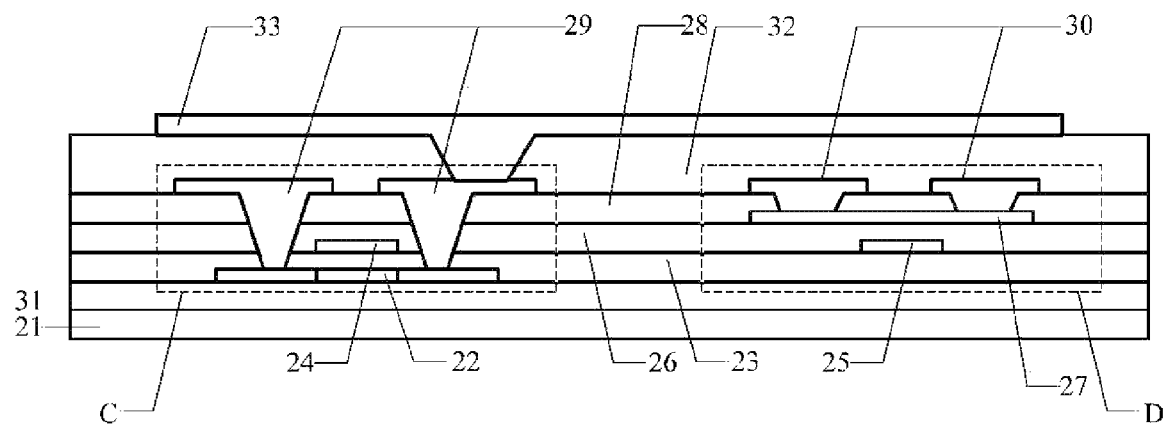

In step S308, a pattern of a pixel layer 33 used as an anode is formed on the planarization layer 32, and the pixel layer 33 is electrically connected to the source or the drain of the PMOS source/drain 29, as shown in FIG. 4h.

In step S309, a pattern of a pixel defining layer 34 is formed on the pixel layer 33, as shown in FIG. 2.

In the CMOS circuit structure, the preparation method thereof and the display device provided in the embodiments of the present disclosure, the PMOS region is of a LTPS TFT structure, that is, the PMOS semiconductor layer is prepared from the P type doped polysilicon material; the NMOS region is of an Oxide TFT structure, that is, the NMOS semiconductor layer is made of an oxide material; three doping processes applied to the NMOS region during the LTPS process may be omitted in the case in which the NMOS semiconductor layer in the NMOS region is made of an oxide material instead of the existing polysilicon material, which may simplify the preparation of the CMOS circuit structure as well as reduce a production cost. Further, the NMOS region is designed to be of a bottom-gate-type TFT structure, which may lead to omission of a step of setting a doping barrier layer before injecting P type ions into the PMOS region, simplifying the preparation of the CMOS circuit structure. Furthermore, since the NMOS semiconductor layer of the NMOS region is made of the oxide material, it is only required to crystallizing the PMOS semiconductor layer of the PMOS region, which may also prolong the lifespan of laser tube, contributing to reduction of the production cost.

The above descriptions are only for illustrating the embodiments of the present disclosure, and in no way limit the scope of the present disclosure. It will be obvious that those skilled in the art may make modifications, variations and equivalences to the above embodiments without departing from the spirit and scope of the present disclosure as defined by the following claims. Such variations and modifications are intended to be included within the spirit and scope of the present disclosure.

What is claimed is:

1. A complementary metal oxide semiconductor CMOS circuit structure, having a PMOS region and an NMOS region, and comprising:
    a base substrate;
    a PMOS semiconductor layer arranged on a portion of the base substrate;
    a gate insulating layer arranged on the PMOS semiconductor layer and on the base substrate;
    PMOS gate and NMOS gate arranged on different portions of the gate insulating layer;
    a first interlayer dielectric layer arranged on the PMOS gate and the NMOS gate and on the gate insulating layer;
    an NMOS semiconductor layer arranged on a portion of the first interlayer dielectric layer that corresponds to the NMOS gate;
    a second interlayer dielectric layer arranged on the NMOS semiconductor layer and on the first interlayer dielectric layer;

PMOS source/drain arranged on a portion of the second interlayer dielectric layer that corresponds to the PMOS semiconductor layer; and NMOS source/drain arranged on a portion of the second interlayer dielectric layer that corresponds to the NMOS semiconductor layer; wherein, the PMOS semiconductor layer, the PMOS gate and the PMOS source/drain are located within the PMOS region; and the PMOS semiconductor layer is prepared from a P type doped polysilicon material;

the NMOS semiconductor layer, the NMOS gate and the NMOS source/drain are located within the NMOS region; and the NMOS semiconductor layer is made of an oxide material.

2. The CMOS circuit structure of claim 1, wherein the oxide material is at least one of indium gallium zinc oxide (IGZO), zinc oxide (ZnO), indium zinc oxide (IZO), and indium tin zinc oxide (ITZO).

3. The CMOS circuit structure of claim 1, further comprising: a buffer layer between the base substrate and the PMOS semiconductor layer.

4. The CMOS circuit structure of claim 1, wherein the PMOS source/drain is connected to the PMOS semiconductor layer through a via-hole, and the NMOS source/drain is connected to the NMOS semiconductor layer through a via-hole.

5. The CMOS circuit structure of claim 1, further comprising: a planarization layer and a pixel layer used as an anode successively located on the PMOS source/drain and the NMOS source/drain, wherein the pixel layer is electrically connected to the source or the drain of the PMOS source/drain through a via-hole.

6. The CMOS circuit structure of claim 5, further comprising: a pixel defining layer above the pixel layer.

7. The CMOS circuit structure of claim 5, wherein the planarization layer is prepared from an organic resin material.

8. The CMOS circuit structure of claim 1, wherein the NMOS region is of a bottom-gate-type TFT structure.

9. A display device comprising the CMOS circuit structure of claim 1.

10. The display device of claim 9, wherein the oxide material is at least one of indium gallium zinc oxide (IGZO), zinc oxide (ZnO), indium zinc oxide (IZO), and indium tin zinc oxide (ITZO).

11. The display device of claim 9, wherein the CMOS circuit structure further comprises: a buffer layer between the base substrate and the PMOS semiconductor layer.

12. The display device of claim 9, wherein in the CMOS circuit structure, the PMOS source/drain is connected to the PMOS semiconductor layer through a via-hole, and the NMOS source/drain is connected to the NMOS semiconductor layer through a via-hole.

13. The display device of claim 9, wherein the CMOS circuit structure further comprises: a planarization layer and a pixel layer used as an anode successively located on the PMOS source/drain and the NMOS source/drain, wherein the pixel layer is electrically connected to the source or the drain of the PMOS source/drain through a via-hole.

14. The display device of claim 13, wherein the CMOS circuit structure further comprises: a pixel defining layer above the pixel layer.

15. The display device of claim 13, wherein the planarization layer in the CMOS circuit structure is prepared from an organic resin material.

16. A method for preparing the CMOS circuit structure of claim wherein the method comprises:

forming a pattern of the PMOS semiconductor layer in the PMOS the region on the base substrate;

forming the gate insulating layer on the PMOS semiconductor layer, and forming a pattern of the PMOS gate in the PMOS region and a pattern of the NMOS gate in the NMOS region on the gate insulating layer;

doping the PMOS semiconductor layer with P type ions;

forming the first interlayer dielectric layer on the PMOS gate and the NMOS gate; and forming a pattern of the NMOS semiconductor layer in the NMOS region on the first interlayer dielectric layer;

forming a pattern of the second interlayer dielectric layer on the NMOS semiconductor layer; and forming a pattern of the PMOS source/drain in the PMOS region and a pattern of the MOS source/drain in the NMOS region on the second interlayer dielectric layer.

17. The method of claim 16, wherein forming the pattern of the PMOS semiconductor layer in the PMOS region on the base substrate comprises:

forming a pattern of a layer of a-Si material on the base substrate; and crystallizing the layer of a-Si material in manner of U-crystallization, laser annealing, selective laser sintering, metal induced crystallization (MIC), metal induced lateral crystallization or continuous granular crystalline silicon, so as to form the PMOS semiconductor layer.

18. The method of claim 16, wherein forming the pattern of the NMOS semiconductor layer in the NMOS region on the first interlayer dielectric layer comprises:

forming the NMOS semiconductor layer in manner of puttering, atomic layer deposition or metal organic chemical vapor deposition.

19. The method of claim 16, wherein before forming the pattern of the PMOS semiconductor layer in the PMOS region on the base substrate, further comprising:

forming a buffer layer on the base substrate.

20. The method of claim 16, further comprising:

forming a pattern of a planarization layer on the PMOS source/drain and the NMOS source/drain;

forming a pattern of a pixel layer used as an anode on the planarization layer, wherein the pixel layer is connected to the source or the drain of the PMOS source/drain; and forming a pattern of a pixel defining layer on the pixel layer.

* * * * *